(12) United States Patent
Butler (10) Patent No.: US 9,922,823 B1
(45) Date of Patent: Mar. 20, 2018

(54) CVD REACTOR AND METHOD FOR NANOMETRIC DELTA DOPING OF DIAMOND

(71) Applicant: Euclid TechLabs, LLC, Solon, OH (US)

(72) Inventor: James E Butler, Huntingtown, MD (US)

(73) Assignee: Euclid TechLabs, LLC, Solon, OH (US)

( * ) Notice: Subject to any disclaimer, the term of this patent is extended or adjusted under 35 U.S.C. 154(b) by 42 days.

(21) Appl. No.: 15/258,624

(22) Filed: Sep. 7, 2016

(51) Int. Cl.
*H01L 21/02* (2006.01)
*H01L 21/66* (2006.01)
*H01J 37/32* (2006.01)

(52) U.S. Cl.
CPC .. *H01L 21/02527* (2013.01); *H01J 37/32201* (2013.01); *H01J 37/32449* (2013.01); *H01J 37/32724* (2013.01); *H01L 21/02019* (2013.01); *H01L 21/02024* (2013.01); *H01L 21/0262* (2013.01); *H01L 21/02376* (2013.01); *H01L 21/02579* (2013.01); *H01L 21/02584* (2013.01); *H01L 21/02634* (2013.01); *H01L 21/02656* (2013.01); *H01L 22/26* (2013.01); *H01J 2237/3321* (2013.01)

(58) Field of Classification Search
CPC ................................................ H01L 21/02527
USPC ......................................................... 438/495
See application file for complete search history.

(56) References Cited

U.S. PATENT DOCUMENTS

| 2008/0231380 A1* | 9/2008 | Shinohara | H01J 23/34 331/86 |
| 2009/0042321 A1* | 2/2009 | Sasaki | H01J 37/32449 438/10 |
| 2009/0127566 A1* | 5/2009 | Tokuda | C23C 16/27 257/77 |
| 2010/0029094 A1* | 2/2010 | Wang | C23C 16/345 438/792 |
| 2015/0299852 A1* | 10/2015 | Ozkan | H01L 27/302 136/255 |

\* cited by examiner

*Primary Examiner* — Moazzam Hossain
*Assistant Examiner* — Omar Mojaddedi
(74) *Attorney, Agent, or Firm* — Maine Cernota & Rardin (57) ABSTRACT

An apparatus and method for creating nanometric delta doped layers in epitaxial diamond includes providing a dummy gas load with gas impedance equivalent to the reactor, and switching gas supplied between the reactor and the gas dummy load without stopping either flow, thereby enabling rapid flow and rapid gas switching without turbulence. An atomically smooth, undamaged substrate can be prepared, preferably in the (100) plane, by etching the surface after polishing to remove subsurface damage. A gas phase chemical getter reactant such as hydrogen disulfide can be used to suppress incorporation of residual boron into the intrinsic layers. Embodiments can produce interfaces between doped and mobile layers that provide at least 100 $cm^2/Vsec$ carrier mobility and $10^{13}$ $cm^{-2}$ sheet carrier concentration.

16 Claims, 6 Drawing Sheets

CVD REACTOR AND METHOD FOR NANOMETRIC DELTA DOPING OF DIAMOND

FIELD OF THE INVENTION

The invention relates to reactors and methods for epitaxial growth of diamond, and more particularly to chemical vapor deposition ("CVD") reactors and methods for creating nanometric delta doped layers in epitaxially grown single crystals of diamond.

BACKGROUND OF THE INVENTION

Diamond is of strong interest as a potential semiconductor material for high voltage, high frequency, and/or high power active and passive electronic devices because of its superlative materials properties, including high electronic carrier mobilities, high breakdown field strength, high thermal diffusivity, favorable matrix for quantum devices, as well as many other desirable optical, chemical, and materials properties. However, a major barrier to exploiting diamond for active electronic applications is that there are no dopants known that have a sufficiently low thermal activation energy barrier to create a concentration of electronic carriers and a carrier mobility in diamond at room temperature that is adequate for most devices of interest.

While there are many known defect and impurity states in the wide bandgap (5.45 eV) of diamond, several of which can act as donors or acceptors of electronic charge, only boron (creating an acceptor state) and phosphorous (creating a donor state) have been demonstrated to be reliable dopants. Boron, the most commonly used diamond dopant, has the smallest activation energy of 0.37 eV at low doping concentrations ($<10^{17}$ cm$^{-3}$). However, this activation energy is still high enough to ensure that only a fraction of the boron present is activated at room temperature, leading to relatively low concentrations of free carriers.

Increasing the boron concentration in diamond reduces the activation energy, such that at a concentration of approximately $3\times10^{20}$ cm$^{-3}$ the metal-to-insulator transition point occurs and a fully-activated impurity band is formed via the quantum tunneling of holes between neighboring boron acceptor states. Unfortunately, as the activation energy of the holes decreases, so does carrier mobility, not only because of the increased impurity scattering but also due to the onset of a low-mobility, hopping-like conduction. The resulting material is one that has sub-unity carrier mobility and typical sheet carrier densities in excess of those that are readily controlled, for example, by a typical field effect transistor (FET).

One approach to creating both high mobility and high carrier concentrations for electronic materials in two dimensions is the formation of "nanometric delta doped" layers, which are heavily doped layers, typically less than five nanometers in thickness, that are located adjacent to high mobility intrinsic material, so that a fraction of the carriers created by the heavily ionized dopant layer reside in the adjacent high mobility layer.

The success of "delta doping" requires the epitaxial growth of a very thin, heavily doped "delta layer" that is typically between 1 and 2 nm thick and is preferably doped to a concentration that is above the metal insulator transition, which for boron in diamond means a concentration of at least approximately $4\times10^{20}$ cm$^{-3}$. Successful delta doping further requires that the interface between the doped "delta" layer and the high mobility intrinsic layer (containing less than $10^{17}$ cm$^{-3}$ boron atoms) must be abrupt, and must also be atomically smooth, so as to minimize carrier scattering.

Recent attempts at delta doping of diamond with boron have failed to demonstrate the theoretically expected performance, and have shown low carrier mobilities, low sheet carrier concentrations, and/or low channel mobility. Some of these studies have attributed this disappointing performance to poor lateral homogeneity and interrupted morphology of the delta layers. Carrier mobilities measured in these studies did not exceed the range of 1 to 4.4 cm$^2$/Vsec which is typical of bulk diamond doped with boron above the metal insulator transition level of 4 to $5\times10^{20}$ cm$^{-3}$. These results are well short of the values of approximately 100 cm$^2$/Vsec mobility and $10^{13}$ cm$^{-2}$ sheet carrier concentrations that are required for the implementation of doped layers of diamond in practical electronic devices.

What is needed, therefore, is an apparatus and method for creating nanometric delta doped layers in epitaxial diamond with interfaces between the doped and high mobility layers that are sufficiently abrupt and smooth to provide at least 100 cm$^2$/Vsec carrier mobility and $10^{13}$ cm$^{-2}$ sheet carrier concentrations.

SUMMARY OF THE INVENTION

An apparatus and method is disclosed for creating nanometric delta doped layers in epitaxial diamond with interfaces between the doped and high mobility layers that are sufficiently abrupt and smooth to provide at least 100 cm$^2$/Vsec carrier mobility and $10^{13}$ cm$^{-2}$ sheet carrier concentrations. The disclosed apparatus includes a novel switched-chamber gas supply that enables rapid switching between gas sources by maintaining constant loads or "impedances" on the outlets of the gas sources, thereby minimizing any turbulence and gas mixing caused by the switching. The method further includes preparation of an atomically smooth, undamaged single crystal diamond substrate surface by finely polishing the surface, preferably in or near the (100) plane, and then etching the surface after polishing to remove any subsurface polishing damage. Embodiments of the method further include maintaining rapid gas flows while adopting extraordinarily slow growth rates to create the sharpest possible interfaces.

Embodiments further include using Type IIa single crystal diamond as the substrate. And in various embodiments a gas phase chemical getter reactant is used to suppress any residual boron incorporation in the intrinsic layers. Embodiments further include heating and maintaining the single crystal diamond substrate surface at a temperature between 700 and 1100° C. during the epitaxial growth.

A first general aspect of the present invention is an epitaxial CVD reactor for growing delta-doped layers on diamond substrates. The reactor includes a reaction chamber configured to enable a flow of gas from an inlet thereof through an interior thereof, a substrate support located within the reaction chamber and configured for supporting a diamond substrate on a surface thereof, a plasma generator configured to excite the gas so as to surround the substrate with a gas plasma, a first gas source, a second gas source, a dummy gas load configured to allow gas from one of the gas sources to flow therethrough, the dummy gas load being configured to present a dummy gas flow impedance to a gas source that is equivalent to a reactor gas flow impedance of the reaction chamber, a gas manifold configured to direct a flow from one of the gas sources to the reaction chamber while directing a flow from the other of the gas sources to the dummy gas load, a gas switch configured to switch the gas flows between the reaction chamber and the dummy gas load, while maintaining both gas flows, and a switch controller configured to control switching by the gas switch of the gas flows.

In embodiments, the reaction chamber is a fused silica tube.

In some embodiments, the plasma generator is configured to excite the gas using electromagnetic radiation. And in some of these embodiments, the plasma generator is a magnetron that generates electromagnetic radiation at 2.45 GHz.

Various embodiments further include a heater embedded in the substrate support and configured for maintaining the substrate surface at a desired temperature. Some embodiments further include a heater and control system configured to maintain a temperature of the diamond substrate at a value that is within the range of 700° C. to 1100° C. with a precision of +/−5° C.

In certain embodiments, the dummy load includes a dummy chamber and dummy support that are substantially identical in their physical configurations to the reaction chamber and substrate support.

Other embodiments further include a second dummy load and a third gas source, the gas manifold and gas switch being configured to direct and switch a gas flow from any of the gas sources to the reaction chamber while directing flows from the other two gas sources to dummy gas loads while maintaining all three gas flows.

A second general aspect of the present invention is a method for preparing a diamond substrate for epitaxial deposition thereupon of a delta doping layer. The method includes polishing a face of the substrate, and etching the polished face of the substrate, thereby removing subsurface damage caused by the polishing step.

In embodiments, the polished face is approximately in the (100) plane. And in some of these embodiments polishing the face includes applying a rough polish in a polish direction that is within five degrees of the (010) direction, followed by a fine polish within five degrees of the (011) direction, the fine polish being continued until polishing tracks resulting from the rough polish are no longer detectable by optical interferometry.

In various embodiments the polished face has a roughness Sa of less than 0.3 nm over at least an 80×80 micron sampling area. In some embodiments the etching is applied using an inductively coupled reactive ion etcher. And in other embodiments the diamond substrate is a plate of single crystal type IIa diamond or type 1b HBHT diamond.

And in certain embodiments the diamond substrate has a dislocation density that is less than $10^4/cm^2$.

A third general aspect of the present invention is a method of depositing epitaxial delta-doped layers on a diamond substrate. The method includes the following steps:

a) providing a CVD reactor according to the first general aspect;

b) filling the first gas source with a first gas mixture that includes carbon atoms but not dopant atoms;

c) filling the second gas source with a second gas mixture that includes both carbon atoms and dopant atoms;

d) placing a diamond substrate having a polished surface on the substrate holder;

e) introducing a flow of the first gas mixture from the first gas source into the reaction chamber, while a flow of the second gas mixture from the second gas source flows into the dummy load;

f) causing the plasma generator to surround the polished surface of the substrate with a plasma of the first gas mixture;

g) waiting until a first epitaxial layer has formed on the polished surface;

h) causing the gas switch to switch the gas sources between the reaction chamber and the dummy load, so that gas from the second gas source is caused to flow through the reaction chamber and the polished surface is surrounded with a plasma of the second gas mixture; and i) allowing a second epitaxial layer to form on the first epitaxial layer.

In embodiments, interfaces between the first and second epitaxial layers and the diamond substrate provide a charge carrier concentration of at least $10^{13}$ cm$^{-2}$ having a carrier mobility of at least 100 cm$^2$/Vsec.

In some embodiments, the first gas mixture further comprises a chemical getter reactant that inhibits incorporation of residual dopant atoms into the first epitaxial layer. And in some of these embodiments the dopant atoms are boron atoms, and the chemical getter reactant is hydrogen disulfide.

In various embodiments, the flows of the first and second gas mixtures are at a rate of approximately 950 sccm.

In certain embodiments, the switching of the gas sources between the reaction chamber and the dummy load is completed within a switching time that is less than 20 seconds. And in some of these embodiments epitaxial growth during the switching time is between 1 and 2 Angstroms.

And some embodiments further include repeating steps e) through i) so as to form third and fourth epitaxial layers.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is an apparatus and method for creating nanometric delta doped layers in epitaxial diamond with interfaces between the doped and high mobility layers that are sufficiently abrupt and smooth to provide at least 100 $cm^2/Vsec$ carrier mobility and $10^{13}$ $cm^{-2}$ carrier concentration.

Figure 1:
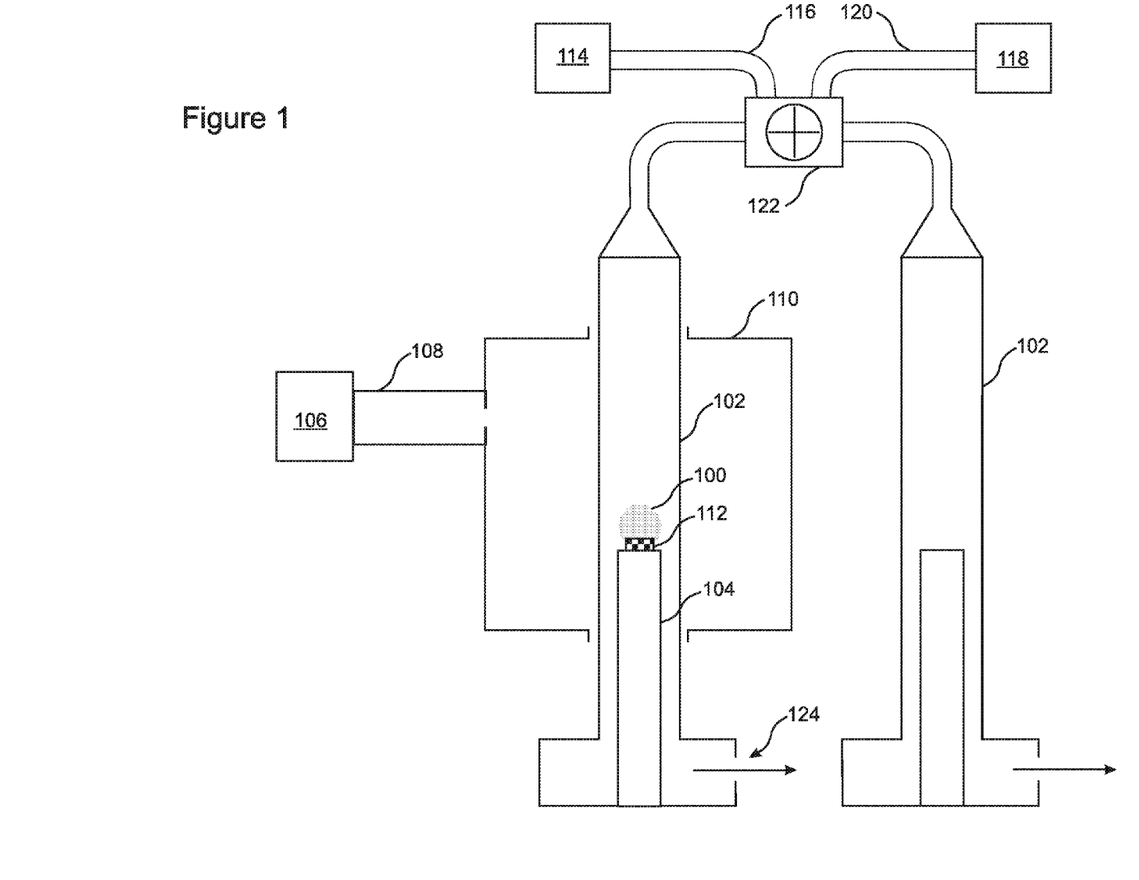
FIG. 1 is a cross sectional diagram illustrating an embodiment of the apparatus of the present invention.

The apparatus of the present invention is a CVD reactor that is able to create nanometric delta-doped layers with ultra-sharp interfaces between doped/undoped material. FIG. 1 is a schematic illustration of an embodiment of the disclosed reactor, in which a microwave plasma excitation zone 100 surrounds a substrate 112 supported by a substrate holder 104 in a reduced pressure region of a vertical quartz tube growth chamber 102. In various embodiments the growth chamber is a fused silica tube 102. In embodiments, the substrate holder 104 can heat the substrate 112 to a temperature of between 700 and 1100° C. as desired.

The plasma in this embodiment is produced by electromagnetic radiation generated by a 2.45 GHz magnetron 106 which is transmitted through a waveguide 108 to a cavity 110. In similar embodiments, the plasmas is created by another method known in the art, such as dc, rf, microwave, or terahertz excitation, combustion flames, or hot wires, filaments, or surfaces. The use of a cylindrical cavity in the embodiment of FIG. 1 enables the generation of a symmetrical plasma ball 100 above the substrate 112 and well separated from the walls of the quartz tube 102 by applying only a low microwave power density in the plasma 100.

In the embodiment of FIG. 1, during intrinsic (undoped) diamond growth, a mixture of purified $H_2+CH_4$ is fed from a first gas supply 114 through a first manifold 116 to the quartz tube 102, where it flows past the substrate 112 and out through an outlet 124 to a gas pumping system (not shown). In embodiments, a chemical "getter" reactant is also included in this gas mixture, as discussed in more detail below. Due to the smooth and unobstructed configurations of the manifold 116 and quartz tube 102, the flow of gas quickly becomes laminar in the region of the substrate 112 once the reaction has been initiated.

So as to provide delta doped layers in the epitaxial diamond, it is necessary to temporarily substitute a gas containing a dopant in place of the $H_2+CH_4$ provided by the first gas supply 114. In some embodiments where the doping is with boron, the gas mixture is switched briefly to $H_2+CH_4+B_2H_6$. According to the present invention, the dopant gas mixture is contained in a second gas supply 118, and is delivered to the quartz tube 102 through a second gas manifold 120 when the gas is switched between the two gas supplies 114, 118 by a gas supply switch 122.

If the gas supplies 114, 118 were simply switched, such that flow from the first supply 114 was halted and flow from the second supply 118 was initiated, the result would likely be to temporarily cause a turbulence and eddy currents in the flow of gas near the substrate 112, leading to "tails" or mixing of the gases in the transition region between the gas mixtures, and a correspondingly broad transition between epitaxial layers in the diamond. This effect is largely due to the sudden change in load or "impedance" that is encountered at the outlets of the gas supplies when a gas flow is interrupted or commenced, and in that regard it is conceptually similar to the reflections of electromagnetic energy such as radio frequency or laser beams that occurs when a sudden change or mismatch of impedance is encountered. Conventional approaches to minimizing this problem would be to switch the gases on and off slowly and gradually, and or to use a very low gas flow rate. However, both of these approaches would tend to broaden the transition between the epitaxial layers.

The present invention implements a novel approach to avoid this problem of turbulence, whereby the gas flows are not stopped, but are merely switched between the reactor and a second "dummy" gas load, such as a second dummy quartz tube 124 and manifold 120, which in embodiments is identical in design to the reactor quartz tube 102 and manifold 116. Making the dummy load physically similar or identical to the reactor ensures that the "impedances" are matched, however dummy loads that do not necessarily duplicate the physical configuration of the reaction chamber but nevertheless are configured to provide an impedance that matches the reaction chamber are included within the scope of the present invention.

The gas supply switch 122 is configured so as to provide a continuous, uninterrupted flow of gas simultaneously from both gas supplies 114, 118 to the two reaction chamber 102 and the dummy load 124, so that switching between the gasses consists merely in a change of direction of each gas from one destination to the other. Because neither gas flow is interrupted, and because the impedances are matched, i.e. in the embodiment of FIG. 1 the manifolds 116, 120 and quartz tubes 102, 124 are identical, the flow from each source is continuous, and the flow "impedance" seen by each source is constant, so that any generation of turbulence due to the switching process is minimized or eliminated.

This duel-load gas switching architecture and method allows embodiments to maintain a high gas flow rate and to switch the gas quickly and abruptly without triggering undue turbulence. For example, embodiments employ a gas flow rate of 950 sccm together with a gas switching time of less than 10 seconds. Keeping the gas flow rate high has the added advantage in various embodiments of suppressing gas buoyancy effects from the hot plasma "ball" 100 above the substrate 112, and thereby reducing the effects of any turbulence resulting from the heating of the plasma.

Embodiments further sharpen the layer transition by maintaining an extraordinarily slow epitaxial growth rate of between 30 and 90 nm per hour, as determined by secondary ion mass spectroscopy sputter profiling ("SIMS-SP") of previously grown epitaxial layers. In embodiments, the total gas pressure was 30 to 50 Torr and the microwave power was 1.5 kW. In various embodiments the gas compositional switching time immediately above the substrate is approximately equivalent to 1-2 angstrom of growth so that, for example, a 20 sec gas switching time implies a desired growth rate of 18-36 nm/hr. These growth rates were only slightly over the rate of etching of a diamond substrate in a similar carbon free plasma.

Further embodiments of the present invention include more than one "dummy" load and more than two gas sources and manifolds, so that a plurality of epitaxial layers can be created on the substrate having differing dopent levels and types. For example, embodiments with two dummy cylinders are able to produce alternating boron-doped and phosphorous-doped epitaxial layers, interspersed with undoped layers.

Obviously, a sharp transition between adjacent layers in an epitaxially grown diamond crystal requires that the diamond substrate surface must be highly polished so as to be as smooth as possible. However, the present inventors have realized that the necessary polishing of the substrate surface inevitably results in some subsurface damage to the substrate. This is problematic, because success of the delta-doping strategy in terms of high carrier mobility requires that the undoped regions near the delta doped layer, i.e. the region of the substrate near the polished surface, must be free of damage and defects, which would otherwise hinder the mobility of the carriers. Accordingly, the method of the present invention includes the additional step of etching the polished substrate surface so as to remove the subsurface damage caused by polishing while retaining the substrate smoothness.

In embodiments, the method includes orienting the polished surface of the substrate in or near the (100) plane. In various embodiments, a "rough" polish is applied, for example using a traditional cast iron skive plate charged with diamond grit of size larger than 2 microns and revolving at between 1500 to 3000 rpm, so as to polish the surface to be within 1 degree of the (100) plane, with the crystal oriented such that skive plate motion is within 5 degrees of the easy "soft" polishing (010) direction. This first polishing step provides a macroscopically flat surface on the crystal that is oriented within 1 degree of the (100) crystallographic plane, but generally leaves polishing tracks or grooves of a few nm depth.

In a second polishing step, in embodiments, another traditional cast iron skive plate, charged with diamond grit of size less than 0.5 microns and revolving at between 1500 to 3000 rpm, is used to polish the previously polished surface, without changing the near (100) plane orientation, with the crystal reoriented in the difficult 'hard' direction relative to the skive plate motion (within 5 degrees of the (011) direction. This step, which has a much slower polishing rate, is continued until the polishing tracks or grooves from the previous polishing step are no longer detectable by optical interferometry, producing a surface with a roughness, Sa, of less than 0.3 nm over at least an 80×80 micron sampling area.

In various embodiments, the polished surface of the substrate crystal is then homogeneously etched, for example in an inductively coupled reactive ion etcher, such as an Oxford Instruments Plasmalab 80 using argon and chlorine, to remove between 0.1 and 10 microns of the diamond surface. This step eliminates the subsurface polishing damage while retaining the smoothness of the polished surface.

In embodiments, the substrate is a plate of single crystal type IIa diamond (no nitrogen detectable by IR absorption spectroscopy) or type 1b HBHT diamond cut from a single (100) growth sector of a low dislocation density (less than $10^4/cm^2$, preferably less the $10^2$) HPHT synthetic diamond. In various embodiments, the size of the substrate crystal can be, for example, 3×3×0.5 mm, 3.5×3.5×0.5 mm, or larger, and can display little or no birefringence when viewed between crossed polarizers. In embodiments, the substrate crystal has a dislocation density below $10^6$ cm-2, and more preferably, below $10^{-2}$.

In embodiments, the residual or inadvertent boron levels in nominally undoped diamond layers is maintained below $10^{17}$ cm-3, and preferably below $10^{16}$ by employing a gas phase chemical getter to suppress the residual boron incorporation in the intrinsic layers. For example, in some of these embodiments hydrogen disulfide is added to the gas phase to form volatile boron sulfur complexes which, at elevated substrate surface temperatures of approximately 850 C or higher, reduces the probability of boron incorporating in the growing diamond layers. As an example, typical growth conditions in embodiments employ a flow of 900 sccm hydrogen (Pd diffusion cell purified), 1.4 sccm methane (ultra pure, 99.999%), 6 to 17 sccm of 0.1% B2H6 diluted in hydrogen, and 6 to 14 sccm of 0.1% H2S diluted in hydrogen.

Embodiments allow programmable doping for growing one or more layers of a pre-determined thickness. For example, the disclosed apparatus and method can be used to form a "two-humped" delta layer for which, according to calculations, the sheet carrier concentration should be increased several times compared to the structure with a single delta-layer.

Measured Results for Representative Embodiments

Figure 2A:
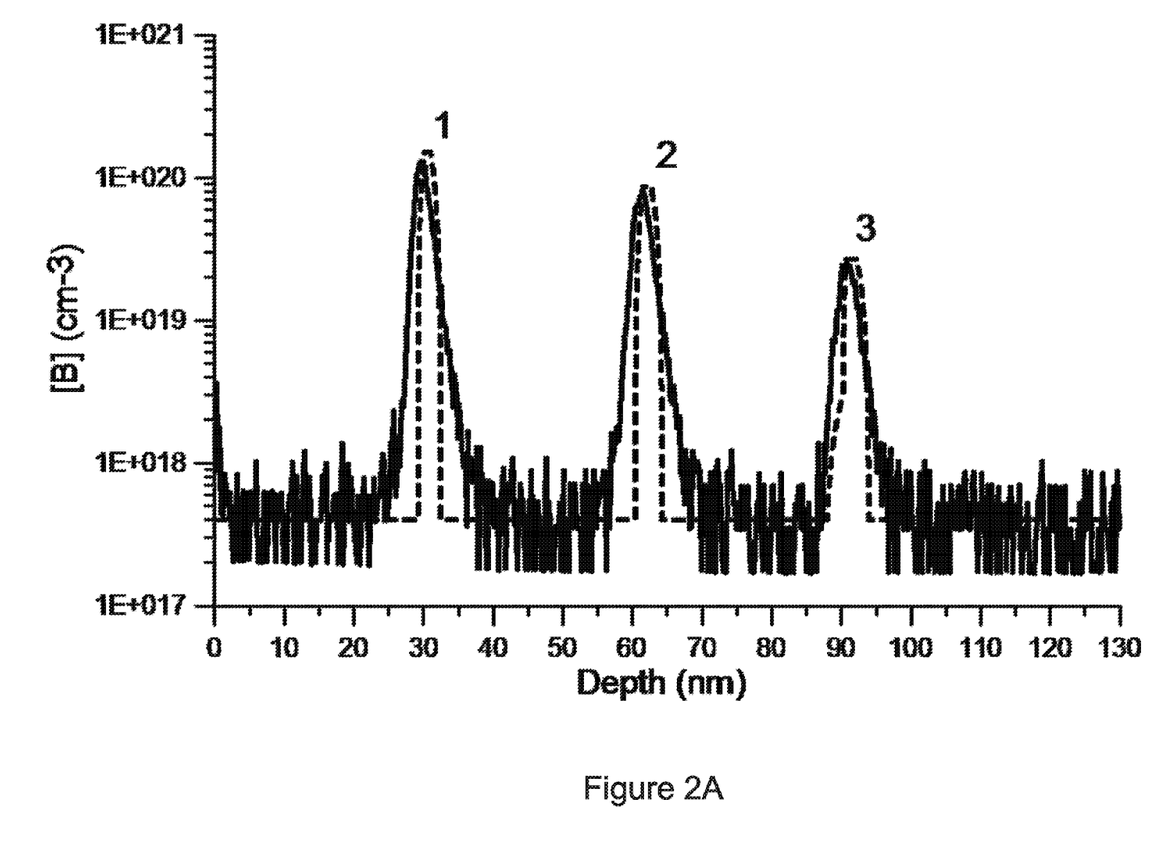
FIG. 2A is a plot of boron concentration profiles resulting from an embodiment of the present invention.
Figure 2B:
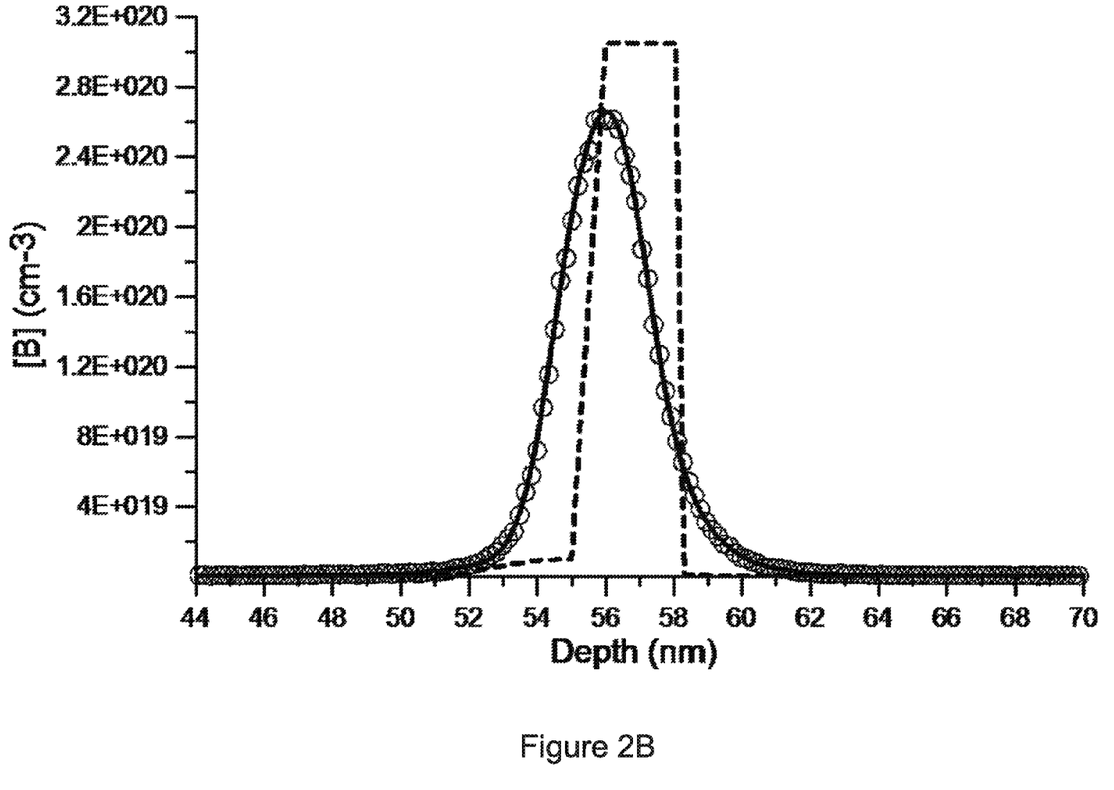
FIG. 2B is a plot of the SIMS-SP profile of a single delta layer of FIG. 2A.

Measurements have been made using the apparatus of FIG. 1 with a total gas flow of 950 sccm (standard cubic centimeters per minute). FIG. 2A is a plot of the resulting boron concentration profiles, as determined by SIMS-SP (solid line) and of the boron concentration profiles recovered using an analytical depth resolution function (dashed line), both as a function of depth in an epitaxially grown diamond. For this measurement, the methane flow was 1.4 sccm, and the B/C ratio was 18570 ppm (1), 12860 ppm (2), 8570 ppm (3) respectively. FIG. 2B is a plot of the SIMS-SP profile of a single delta layer (open circles) of the Boron concentration profiles recovered using an analytical depth resolution function (dashed line), and the resulting fit profile (solid line).

Figure 2C:
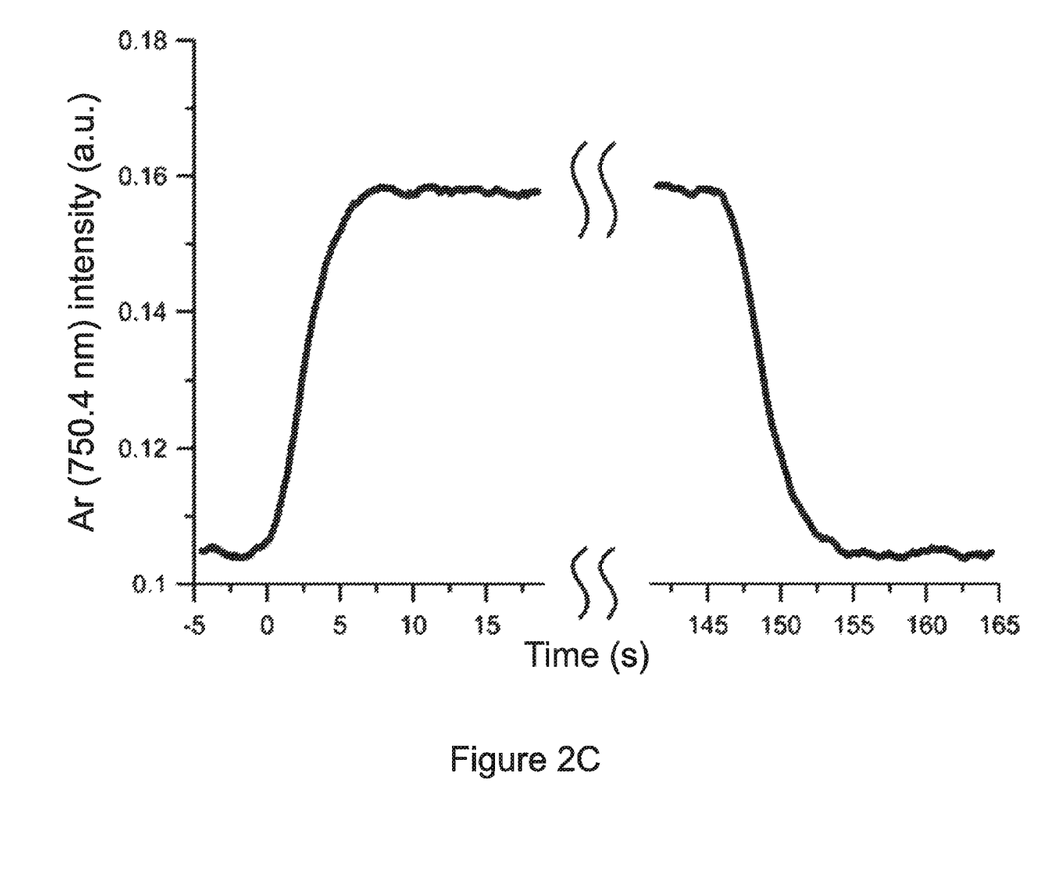
FIG. 2C is a plot of a time-resolved plasma optical emission (line Ar 750.4 nm) of an embodiment of the present invention.

To measure the switching time from one gas manifold to the other, argon was used instead of boron as the "dopant" so that a spectrometer could be used to measure the time-resolved intensity of the Ar emission line during gas mixture switching. The plasma was maintained in the $H_2+CH_4$ gas mixture at a total flow of 950 sccm, and was switched to $H_2+CH_4$ Ar at time t=0. Then, the gas mixture was switched back to $H_2+CH_4$ at time t=147 s. FIG. 2C shows the time-resolved plasma optical emission (line Ar 750.4 nm), collected using a SOLAR TII spectrometer. Because of the low reactivity of the inert gas argon, the measured gas flow switching times (up to 10 s) in FIG. 1 represent the "gas-dynamic" times.

Figure 3A:
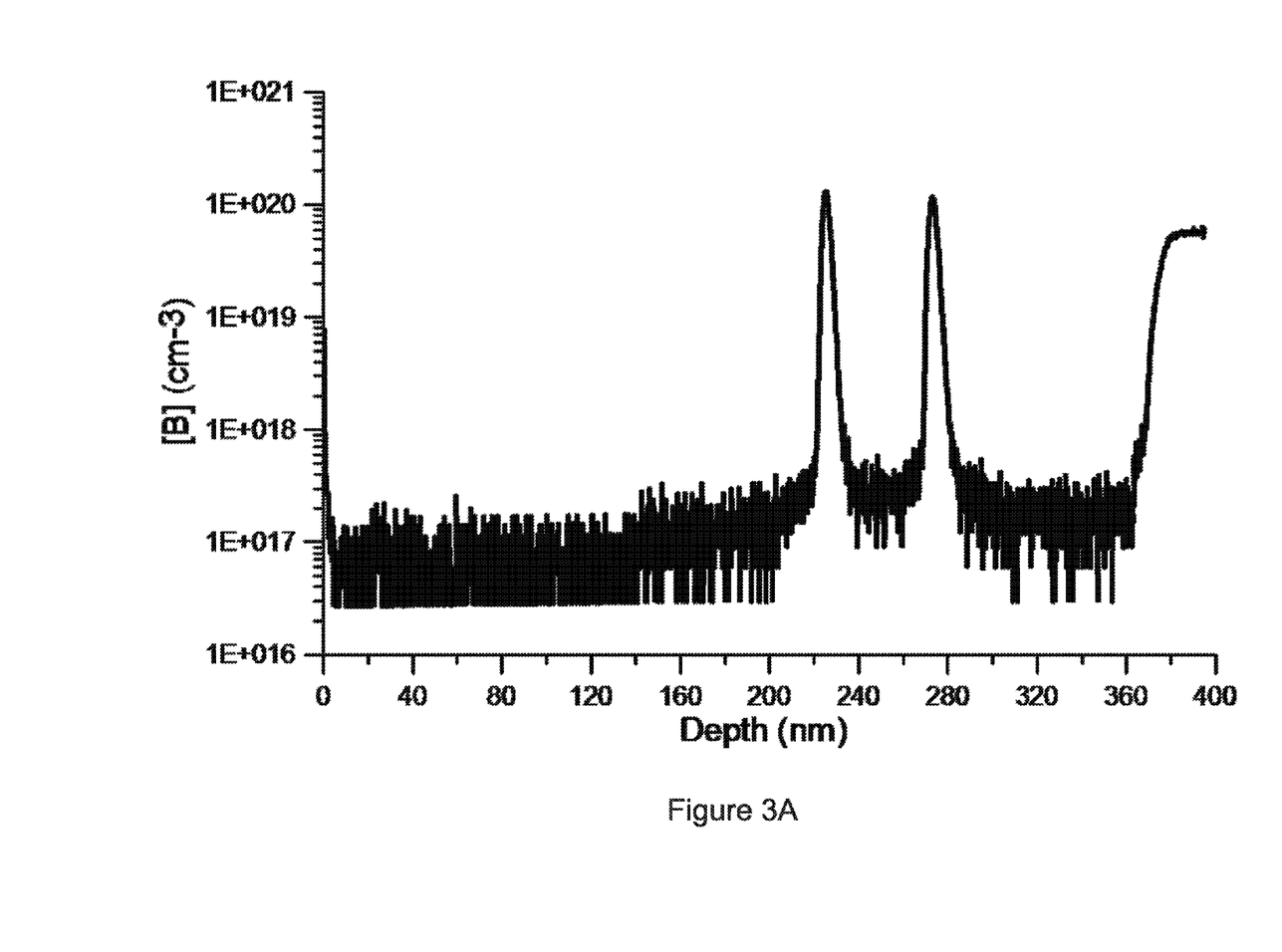
FIG. 3A is a SIMS-SP plot of the boron concentration in a sample created using the present invention wherein 2 separate delta layers were grown over an intrinsic buffer layer on a heavily boron doped layer.
Figure 3B:
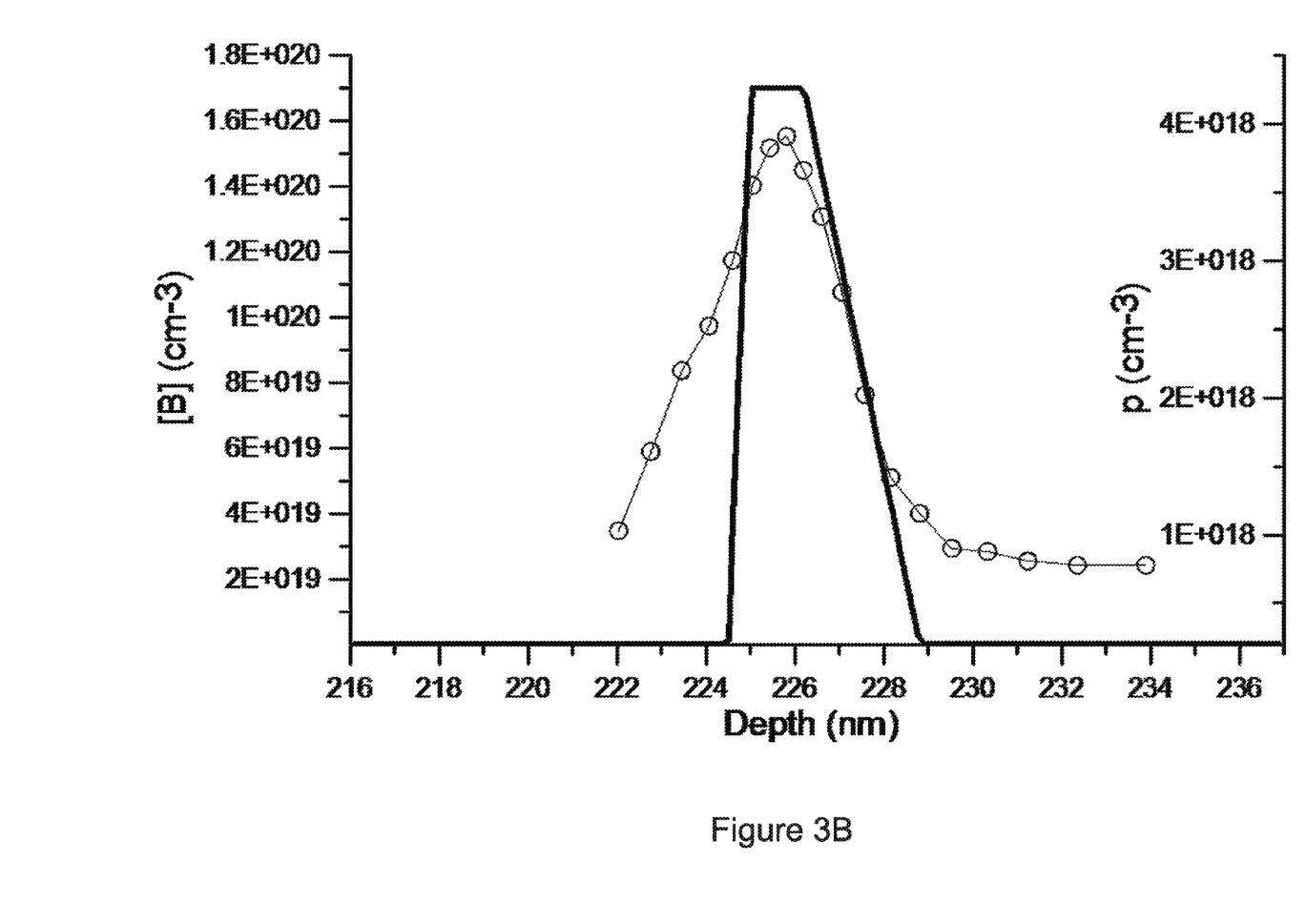
FIG. 3B presents the results of capacitance versus voltage measurements on mesa structures of the sample of FIG. 3A showing the apparent profile of the hole concentration in one delta layer.

FIG. 3A presents a SIMS-SP plot of the boron concentration in a sample wherein 2 separate delta layers were grown over an intrinsic buffer layer on a heavily boron doped layer. FIG. 3B presents the results of capacitance versus voltage measurements on mesa structures prepared on the sample shown in FIG. 3A, showing the apparent profile of the hole concentration in one delta layer. Note that the measured hole concentration outside the delta layer is more than an order of magnitude above the residual boron concentration measured by SIMS-SP of less than $4\times10^{17}$ cm-3.

There are many parallel electrical conduction paths in a sample with a capped single delta layer. These consist of conduction on the surface, in the bulk intrinsic capping layer, in the heavily doped delta layer, in the intrinsic layers on either side and adjacent to the delta layer, in the bulk intrinsic buffer layer, and in the diamond substrate. Surface conduction is prevented by oxidation of the diamond surface, but no other paths can be ignored. Conduction in the heavily doped delta layer is characterized by low mobilities and high carrier concentrations, typically 3 to 5 $cm^2/Vsec$ and $10^{20}$ cm-3. Conversely, conduction in the CVD grown bulk intrinsic layers have high mobilities, greater than 1000 $cm^2/Vsec$, but low carrier concentrations. Conduction in the diamond substrate may vary depending on the unintentional doping of the HPHT substrate with B and N, but generally, these substrates are insulating.

For Hall effect measurements with sheet carrier concentrations below $10^{12}$ cm-2, the dominant conduction path is likely the high mobility bulk intrinsic buffer and capping layers, while for carrier concentrations above $10^{14}$ cm-2, the dominant contribution is from conduction in the low mobility, heavily doped delta layer.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

The invention illustratively disclosed herein suitably may be practiced in the absence of any element which is not specifically disclosed herein and is not inherently necessary. However, this specification is not intended to be exhaustive. Although the present application is shown in a limited number of forms, the scope of the invention is not limited to just these forms, but is amenable to various changes and modifications without departing from the spirit thereof. One of ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

I claim:

1. An epitaxial CVD reactor for growing delta-doped layers on diamond substrates, the reactor comprising:
a reaction chamber configured to enable a flow of gas from an inlet thereof through an interior thereof;
a substrate support located within the reaction chamber and configured for supporting a diamond substrate on a surface thereof;
a plasma generator configured to excite the gas so as to surround the substrate with a gas plasma;
a first gas source;
a second gas source;
a dummy gas load configured to allow gas from one of the gas sources to flow therethrough, the dummy gas load being configured to present a dummy gas flow impedance to a gas source that is equivalent to a reactor gas flow impedance of the reaction chamber;
a gas manifold configured to direct a flow from one of the gas sources to the reaction chamber while directing a flow from the other of the gas sources to the dummy gas load;
a gas switch configured to switch the gas flows between the reaction chamber and the dummy gas load, while maintaining both gas flows; and
a switch controller configured to control switching by the gas switch of the gas flows.

2. The reactor of claim 1, wherein the reaction chamber is a fused silica tube.

3. The reactor of claim 1, wherein the plasma generator is configured to excite the gas using electromagnetic radiation.

4. The reactor of claim 3, wherein the plasma generator is a magnetron that generates electromagnetic radiation at 2.45 GHz.

5. The reactor of claim 1, further comprising a heater embedded in the substrate support and configured for maintaining the substrate surface at a desired temperature.

6. The reactor of claim 1, further comprising a heater and control system configured to maintain a temperature of the diamond substrate at a value that is within the range of 700° C. to 1100° C. with a precision of +/−5° C.

7. The reactor of claim 1, wherein the dummy load includes a dummy chamber and dummy support that are substantially identical in their physical configurations to the reaction chamber and substrate support.

8. The reactor of claim 1, further comprising a second dummy load and a third gas source, the gas manifold and gas switch being configured to direct and switch a gas flow from any of the gas sources to the reaction chamber while directing flows from the other two gas sources to dummy gas loads while maintaining all three gas flows.

9. A method of depositing epitaxial delta-doped layers on a diamond substrate, the method comprising:
a) providing a CVD reactor according to claim 1;
b) filling the first gas source with a first gas mixture that includes carbon atoms but not dopant atoms;
c) filling the second gas source with a second gas mixture that includes both carbon atoms and dopant atoms;
d) placing a diamond substrate having a polished surface on the substrate holder;
e) introducing a flow of the first gas mixture from the first gas source into the reaction chamber, while a flow of the second gas mixture from the second gas source flows into the dummy load;
f) causing the plasma generator to surround the polished surface of the substrate with a plasma of the first gas mixture;
g) waiting until a first epitaxial layer has formed on the polished surface;
h) causing the gas switch to switch the gas sources between the reaction chamber and the dummy load, so that gas from the second gas source is caused to flow through the reaction chamber and the polished surface is surrounded with a plasma of the second gas mixture; and
i) allowing a second epitaxial layer to form on the first epitaxial layer.

10. The method of claim 9, wherein interfaces between the first and second epitaxial layers and the diamond substrate provide a charge carrier concentration of at least $10^{13}$ cm-2 having a carrier mobility of at least 100 cm$^2$/Vsec.

11. The method of claim 9, wherein the first gas mixture further comprises a chemical getter reactant that inhibits incorporation of residual dopant atoms into the first epitaxial layer.

12. The method of claim 11, wherein the dopant atoms are boron atoms, and the chemical getter reactant is hydrogen disulfide.

13. The method of claim 9, wherein the flows of the first and second gas mixtures are at a rate of approximately 950 sccm.

14. The method of claim 9, wherein the switching of the gas sources between the reaction chamber and the dummy load is completed within a switching time that is less than 20 seconds.

15. The method of claim 14, wherein epitaxial growth during the switching time is between 1 and 2 Angstroms.

16. The method of claim 9, further comprising repeating steps e) through i) so as to form third and fourth epitaxial layers.

* * * * *

UNITED STATES PATENT AND TRADEMARK OFFICE
CERTIFICATE OF CORRECTION

PATENT NO. : 9,922,823 B1
APPLICATION NO. : 15/258624
DATED : March 20, 2018
INVENTOR(S) : James E. Butler It is certified that error appears in the above-identified patent and that said Letters Patent is hereby corrected as shown below:

In the Specification

Column 3, Line 52 reads $104/cm^2$ and it should read $10^4/cm^2$

Column 7, Line 42 reads preferably less the $10^2$ and it should read preferably less than $10^2/cm^2$ Column 7, Line 48 reads $10^{-2}$ and it should read $10^2\,cm^{-2}$ Signed and Sealed this
Twenty-second Day of May, 2018

Andrei Iancu
*Director of the United States Patent and Trademark Office*